(12) United States Patent
Yoda

(10) Patent No.: US 6,900,117 B2
(45) Date of Patent: May 31, 2005

(54) METHOD OF FABRICATING BUMPS UTILIZING A RESIST LAYER HAVING PHOTOSENSITIVE AGENT AND RESIN

(75) Inventor: Tsuyoshi Yoda, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 57 days.

(21) Appl. No.: 09/984,223

(22) Filed: Oct. 29, 2001

(65) Prior Publication Data

US 2002/0061641 A1 May 23, 2002

(30) Foreign Application Priority Data

Oct. 30, 2000 (JP) ........................................ 2000-330835
Sep. 14, 2001 (JP) ........................................ 2001-279578

(51) Int. Cl.$^7$ .............................................. H01L 21/44
(52) U.S. Cl. ...................... 438/612; 438/613
(58) Field of Search .......................... 29/831, 846, 874; 438/108, 612, 613, 614, 615, 672, 342, 343

(56) References Cited

U.S. PATENT DOCUMENTS

| | | | | |
|---|---|---|---|---|
| 4,589,734 A | * | 5/1986 | Needham et al. | 349/106 |
| 4,806,456 A | * | 2/1989 | Katoh | 430/296 |
| 5,121,237 A | * | 6/1992 | Ikeda et al. | 349/110 |
| 5,171,711 A | * | 12/1992 | Tobimatsu | 438/614 |
| 5,226,232 A | | 7/1993 | Boyd | 29/846 |
| 5,492,863 A | * | 2/1996 | Higgins, III | 438/610 |
| 5,877,076 A | * | 3/1999 | Dai | 438/597 |
| 5,935,762 A | * | 8/1999 | Dai et al. | 430/312 |
| 5,981,146 A | * | 11/1999 | Kumada et al. | 430/273.1 |
| 5,985,513 A | * | 11/1999 | Kani et al. | 430/270.1 |
| 6,015,652 A | * | 1/2000 | Ahlquist et al. | 430/315 |
| 6,245,594 B1 | * | 6/2001 | Wu et al. | 438/108 |
| 6,396,145 B1 | * | 5/2002 | Nagai et al. | 257/737 |

FOREIGN PATENT DOCUMENTS

| | | |
|---|---|---|
| CN | 1047398 A | 11/1990 |
| EP | 0 397 460 | 11/1990 |
| JP | A 61-51825 | 3/1986 |
| JP | A 1-105537 | 4/1989 |
| JP | A 2-10363 | 1/1990 |
| JP | A 8-45831 | 2/1996 |
| JP | A-8-288290 | 11/1996 |
| JP | A-9-205268 | 8/1997 |
| JP | A 11-154634 | 6/1999 |

* cited by examiner

Primary Examiner—Alonzo Chambliss
(74) Attorney, Agent, or Firm—Oliff & Berridge, PLC

(57) ABSTRACT

A bump forming method having a step of patterning a resist layer so as to have a penetrating hole above a pad, a step of applying energy to cause cross-linking in the resist layer, and hardening at least a surface of the resist layer, and a step of forming a metal layer electrically connected to the pad within the penetrating hole.

21 Claims, 10 Drawing Sheets

METHOD OF FABRICATING BUMPS UTILIZING A RESIST LAYER HAVING PHOTOSENSITIVE AGENT AND RESIN

Japanese Patent Applications No. 2000-330835, filed on Oct. 30, 2000, and No. 2001-279578, filed on Sep. 14, 2001, are hereby incorporated by reference in their entirety.

BACKGROUND OF THE INVENTION

1. Field of the Invention

The present invention relates to a method of bump formation, a semiconductor device and method of manufacturing the semiconductor device, a circuit board and an electronic instrument.

2. Description of Related Art

When forming bumps on the pads of a semiconductor chip, the method of forming bumps using electroless plating is known. For example, the method is known in which a resist layer is formed on the surface of a semiconductor chip so as to provide a plurality of penetrating holes, and with these penetrating holes as walls, bumps of straight form are formed.

However, in electroless plating, an alkaline solvent may be used, and because of this the patterned resist layer may be dissolved. If the resist layer is dissolved, penetrating holes corresponding to the narrow pitch of the pads cannot be formed, and it is not possible to form the bumps with a narrow pitch. With a rubber-based resist which resists solution in an alkaline solvent, after exposure to light, in the steps of resist layer development and removal, it is necessary to use an organic solvent, which presents handling problems, and makes the process difficult.

SUMMARY OF THE INVENTION

A method of bump formation according to the present invention comprises the steps of:

patterning a resist layer so as to have a penetrating hole above a pad;

applying energy to cause cross-linking in the resist layer, and hardening at least a surface of the resist layer; and forming a metal layer which is electrically connected to the pad, within the penetrating hole.

A method of manufacturing a semiconductor device according to the present invention comprises a step of forming a bump including the metal layer on the pad of a semiconductor element by the above-described bump forming method.

A semiconductor device according to the present invention is manufactured by the above described method of manufacturing a semiconductor device.

A circuit board according to the present invention has the above described semiconductor device mounted.

An electronic instrument according to the present invention has the above described semiconductor device.

DETAILED DESCRIPTION OF THE EMBODIMENTS

Figure 1:
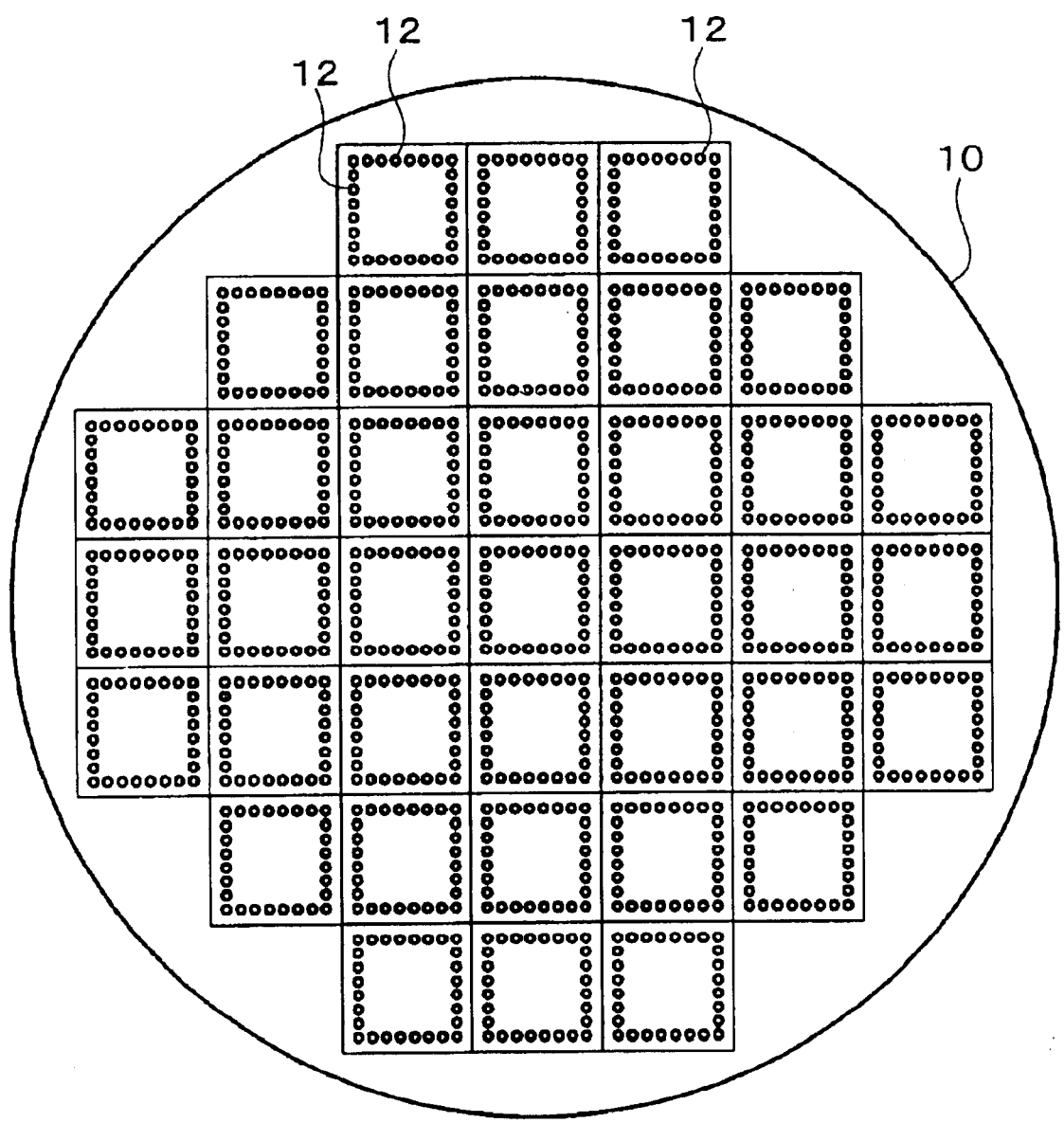
FIG. 1 is a plan view of a semiconductor wafer for illustrating the bump forming method according to a first embodiment of the present invention.

Embodiments of the present invention solve the above described problems, and have as their objective the provision of a method of bump formation supporting pads with a narrow pitch and resistance to electroless plating treatment, a semiconductor device and method of manufacture thereof, a circuit board and an electronic instrument.

(1) A method of bump formation according to one embodiment of the present invention comprises the steps of:

patterning a resist layer so as to have a penetrating hole above a pad;

applying energy to cause cross-linking in the resist layer, and hardening at least a surface of the resist layer; and forming a metal layer which is electrically connected to the pad, within the penetrating hole.

According to the embodiment of the present invention, by hardening a surface of the resist layer after the resist layer is patterned, deformation of the shape of the resist layer in the subsequent process can be prevented. That is to say, a bump can be formed with a desired form without the shape of the penetrating hole being changed, for example by chemicals or heat.

(2) In the step of hardening the resist layer of this method of bump formation, the resist layer may be cured and irradiated with light energy.

By means of this, cross-linking can be caused within the limits of resistance of the resist layer. Therefore, in this process, the surface of the resist layer can be hardened without deformation of the resist layer pattern.

(3) In this method of bump formation, the resist layer may have as principal constituents a resin and a photosensitive agent; and in the light energy, a property of causing cross-linking of the resin may be stronger than a property of causing a reaction of the photosensitive agent.

Since the light wave causing a reaction of the photosensitive agent are weaker, a violent reaction of the photosensitive agent can be restrained. By virtue of this, foaming of the resist layer and deformation of the pattern can be prevented.

(4) In the step of hardening the resist layer of this method of bump formation, the resist layer may be heated to prevent the photosensitive agent from reacting with water and to cause cross-linking of the photosensitive agent and the resin.

This makes it possible to harden a surface of the resist layer.

(5) In this method of bump formation, the resist layer may have as principal constituents a resin and an acid generator.

(6) In this method of bump formation, the resin of the resist layer may be a novolac resin.

A novolac-based resist facilitates fine patterning.

(7) In this method of bump formation, the pad may be covered by an insulating film at an extremity, avoiding a center portion; and the penetrating hole may be formed to communicate with an opening in the insulating film.

(8) In this method of bump formation, the pad may be covered by an insulating film; and an opening may be formed in the insulating film to expose at least part of the pad with the penetrating hole as a mask opening.

Since the opening is formed in the insulating film by using the penetrating hole in the resist layer and a metal layer electrically connected to the pad is formed, the bump can be formed by a simple process. Therefore, the labor of treating the resist layer can be saved.

(9) In this method of bump formation, the opening in the insulating film may be formed by dry etching before the step of hardening the resist layer.

Since the process of hardening the resist layer is carried out after the dry etching process, the extreme surface of the resist layer can be hardened even if part of the resist layer is etched away by etching.

(10) In this method of bump formation, the resist layer may be formed of a positive type of material.

(11) In this method of bump formation, the resist layer may be formed of a negative type of material.

(12) In the step of patterning the resist layer of this method of bump formation, the penetrating hole may be formed by exposing the resist layer to remove part of the resist layer over the pad.

(13) In this method of bump formation, the resist layer may be formed to be sloping at an opening extremity of the penetrating hole; and the metal layer may be formed to be lower than the opening extremity of the penetrating hole in the step of forming the metal layer.

Since the metal layer is formed to be lower than the opening extremity of the penetrating hole, even when the opening extremity of the penetrating hole is sloping, a bump of straight form can be formed, for example.

(14) In the step of forming the metal layer of this method of bump formation, the metal layer may be formed by electroless plating.

By means of this, since the electroless plating is carried out after hardening the surface of the resist layer, the resist layer is not deformed for example by heat treatment in the electroless plating. Therefore, in the electroless plating process, the metal layer can be formed without needing to consider the resistance of the resist layer.

(15) In this method of bump formation, the electroless plating may include a step of using an alkaline solvent.

Since the alkaline solvent is used after hardening the surface of the resist layer, there is no deformation of the resist layer by the alkaline solvent.

(16) In this method of bump formation, the metal layer may be any one of a layer of nickel, a layer of nickel and gold, a layer of nickel and copper, a layer of copper, a layer of nickel and gold and copper, and a layer of nickel and copper and tin.

(17) This method of bump formation may further comprise a step of removing the resist layer.

(18) In this method of bump formation, the step of hardening the resist layer may be carried out at pressure reduced from atmospheric pressure.

By means of this, the solvent included in the resist layer is evaporated, and cross-linking of the resist layer can be promoted.

(19) A method of manufacturing a semiconductor device according to one embodiment of the present invention comprises a step of forming a bump including the metal layer on the pad of a semiconductor element by the above-described bump forming method.

The semiconductor element may be a semiconductor wafer or a semiconductor chip.

(20) A semiconductor device according to one embodiment of the present invention is manufactured by the above described method of manufacturing a semiconductor device.

(21) A circuit board according to one embodiment of the present invention has the above described semiconductor device mounted.

(22) An electronic instrument according to one embodiment of the present invention has the above described semiconductor device.

The present invention is now described in terms of a number of embodiments, with reference to the drawings. However, the present invention is not limited to these embodiments.

First Embodiment

FIGS. 1 to 4C show a first embodiment of a method of bump formation to which the present invention is applied. In this embodiment, the example is described in which bumps are formed on a semiconductor wafer (semiconductor element), but the method of bump formation of the present invention is not limited to this. For example, it may be applied when bumps are formed on an interconnecting pattern. In this case, lands of the interconnecting pattern correspond to the pads. The present invention may be applied when bumps are formed on the pads of a semiconductor chip (semiconductor element). The form of the semiconductor chip may equally be a rectangular parallelepiped or spherical.

Figure 2:
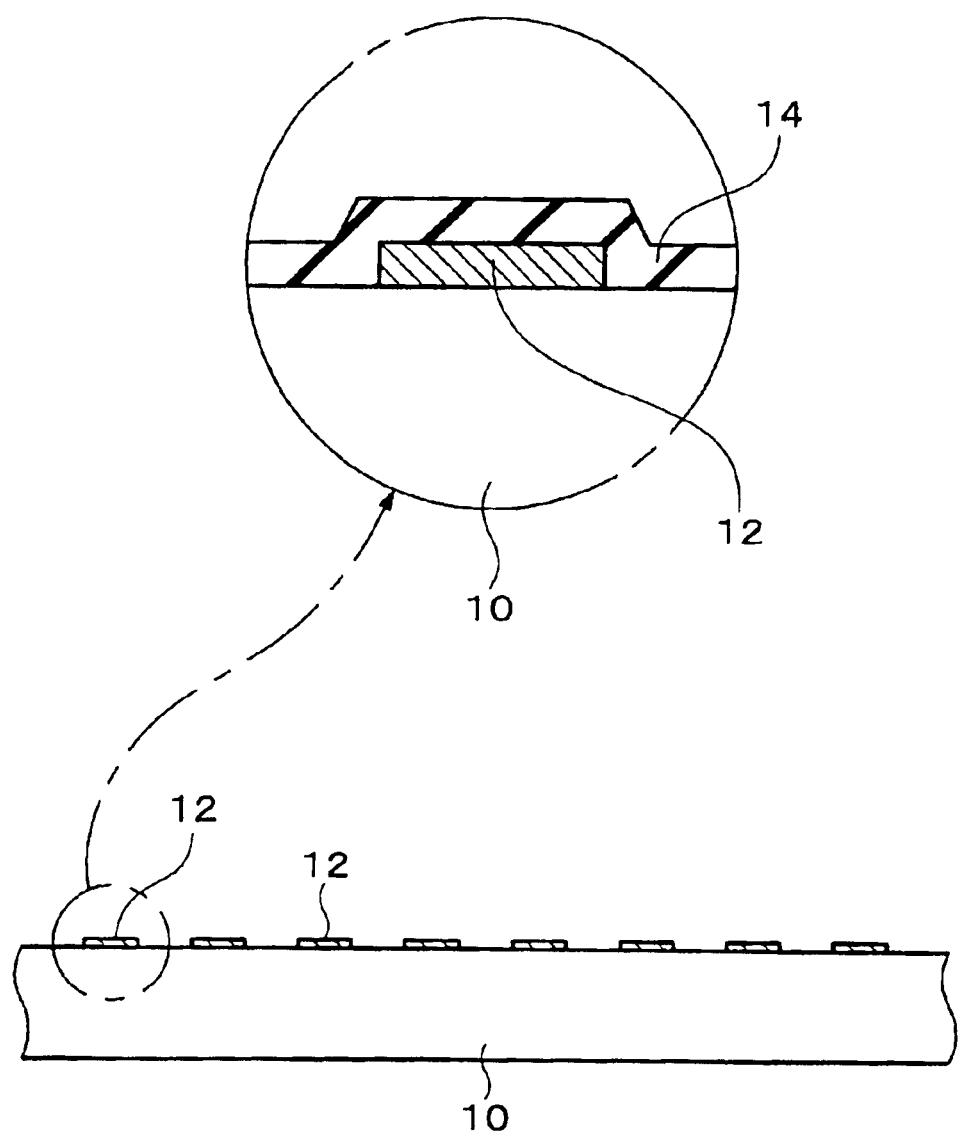
FIG. 2 is a sectional view of part of the semiconductor wafer for illustrating the bump forming method according to the first embodiment of the present invention.

As shown in FIGS. 1 and 2, a semiconductor wafer 10 is taken. FIG. 1 is a plan view of the semiconductor wafer 10. The semiconductor wafer 10 is cut into a plurality of semiconductor chips in a later step, along cutting lines. The semiconductor chips are commonly cut in a rectangular shape, but are not limited to this shape, and may for example be circular.

The semiconductor wafer 10 has a plurality of pads 12. The pads 12 form the electrodes of an integrated circuit formed within the semiconductor wafer 10. The pads 12 are formed for each region to form an individual semiconductor chip. The pads 12 are commonly formed on one surface of the semiconductor wafer 10, on the periphery of the semiconductor chip region (two sides or four sides). In this case, the pads 12 are formed on the surface of the semiconductor wafer 10, on the outside of the region of formation of the integrated circuit (active region). Alternatively, the pads 12 may be formed in a region including the inside of the active region of the surface of the semiconductor wafer 10. In this case, the pads 12 may be disposed in a matrix of a plurality of rows and columns.

The pads 12 are commonly formed to be thin and flat on the semiconductor wafer 10, but the form in elevation or longitudinal cross section is not limited, and they may be flush with the surface of the semiconductor wafer 10. The shape in plan view of the pads 12 is not particularly limited, and may be a circle or a rectangle. The pads 12 may be formed of aluminum, aluminum alloy, copper, or the like. The pitch of the pads 12 can be freely determined according to the design, but may be, for example, a narrow pitch of approximately 50 μm or less. The invention shown in this embodiment is effective when the pads 12 have a narrow pitch.

FIG. 2 is a sectional view of a part of the semiconductor wafer 10. On the surface of the semiconductor wafer 10 on which the pads 12 are formed, an insulating film 14 is formed. The insulating film 14 is formed to cover the pads 12. That is to say, in the example shown in the drawings, the pads 12 are insulated by the insulating film 14. The insulating film 14 consists of a single layer or multiple layers. The insulating film 14 may be a conventional passivation layer. The insulating film 14 can be formed of, for example, $SiO_2$, SiN, or polyimide resin, or the like. It should be noted that as shown in the embodiments described below, the semiconductor wafer 10 used may have openings already formed in the insulating film 14 over the pads 12.

Figure 3A:
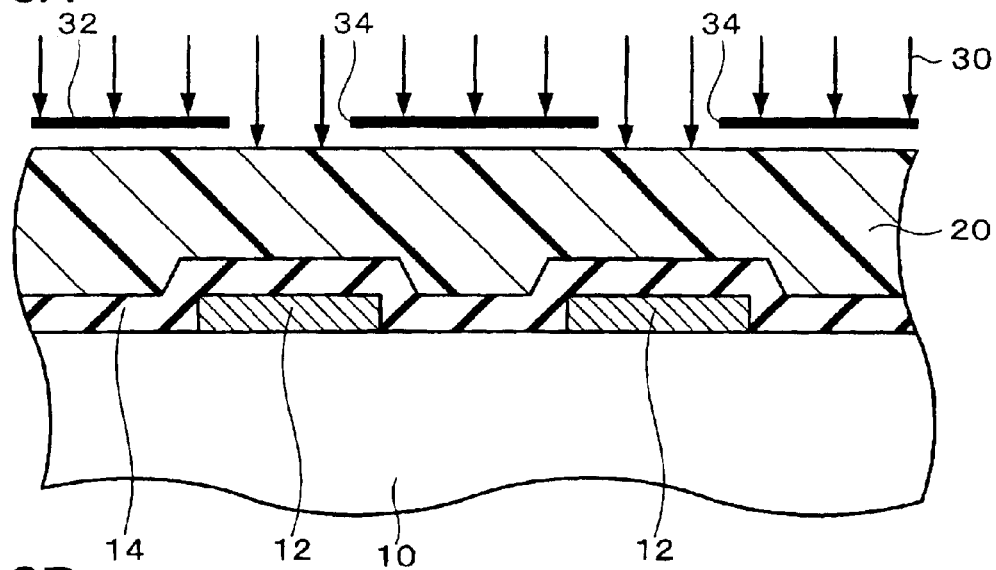
FIGS. 3A to 3C illustrate the bump forming method according to the first embodiment of the present invention.
Figure 3B:
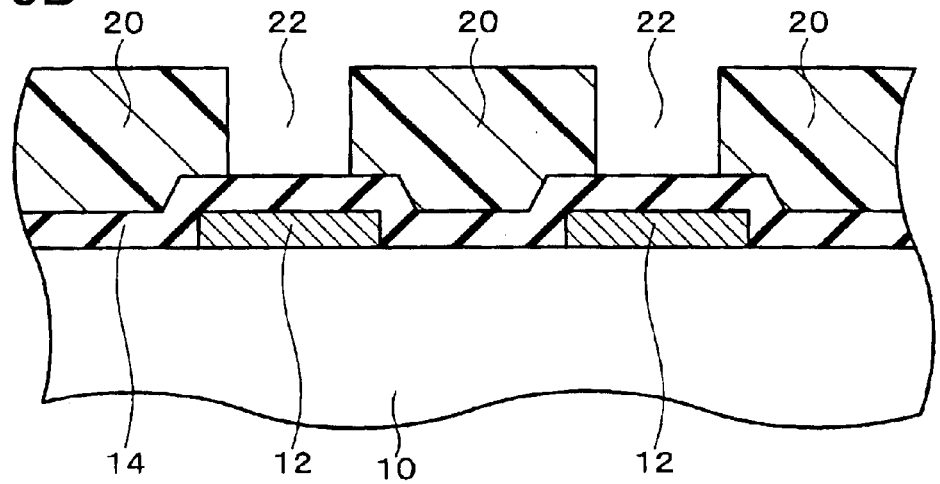

As shown in FIGS. 3A and 3B, a resist layer 20 is patterned. First, as shown in FIG. 3A, the resist layer 20 is provided on the surface of the semiconductor wafer 10 on which the pads 12 are formed, that is, over the insulating film 14. The resist layer 20 is provided to cover the whole of the semiconductor wafer 10, including over the pads 12. The resist layer 20 can be freely determined according to the bump height, but may for example be formed with a thickness of around 10 to 30 μm.

As the resist layer 20, a photosensitive material may be used. The resist layer 20 may be a resin which in response to energy 30 (for example, ultraviolet radiation or the like) changes its nature. That is to say, photolithographic technology may be applied to pattern the resist layer 20. In this case, the resist layer 20 may be such that when irradiated with energy 30, its solubility increases (positive type). A positive type of resist layer 20 is generally, in electroless plating treatment, soluble in an alkaline solvent, but according to the invention shown by this embodiment, this is improved. It should be noted that for the as the material of the resist layer 20, a material including novolac resin may be used. With a novolac-based material, since the nature of only the parts irradiated with the energy 30 can be changed, it is possible to apply fine patterning to the resist layer 20.

For example, a mask 32 in which openings 34 are formed is disposed over the resist layer 20, and exposed to irradiated energy 30. When the resist layer 20 is such that when irradiated with the energy 30 its solubility increases (positive type), the openings 34 are disposed over the region of formation of penetrating holes 22. By the exposure, the solubility of the parts of the resist layer 20 over the pads 12 increases. By subsequent development, as shown in FIG. 3B, the parts of the resist layer 20 over the pads 12 are removed, and the penetrating holes 22 are formed.

The penetrating holes 22 in the resist layer 20 are formed over the pads 12 and on the insulating film 14. In more detail, in plan view of the semiconductor wafer 10, the penetrating holes 22 are formed to overlie at least a portion of the pads 12. On the inside of the penetrating holes 22, the insulating film 14 is exposed. The penetrating holes 22 are preferably formed in a region including the center portion of the pads 12. By means of this, the pads 12 and bumps can be definitely electrically connected. The penetrating holes 22 are preferably formed with walls that rise perpendicularly to the surface of the semiconductor wafer 10. By doing this, bumps which rise perpendicularly can be formed.

The penetrating holes 22 may be formed in a form which does not extend beyond the periphery of the pads 12. By means of this, bumps can be formed corresponding to the narrow pitch of the pads 12, so that there are no short circuits between adjacent pads 12. Alternatively, the penetrating holes 22 may be formed with a form the same as or exceeding the periphery of the pads 12. It should be noted that the plan form of the penetrating holes 22 may be a rectangle, circle, or other shape.

In addition to the example shown in the drawing, the penetrating holes 22 may be formed by etching the resist layer 20. In this case, the resist layer 20 may be a non-photosensitive resist. Alternatively, the resist layer 20 may be formed by applying a material and directly patterning by screen printing or the inkjet method.

Figure 3C:
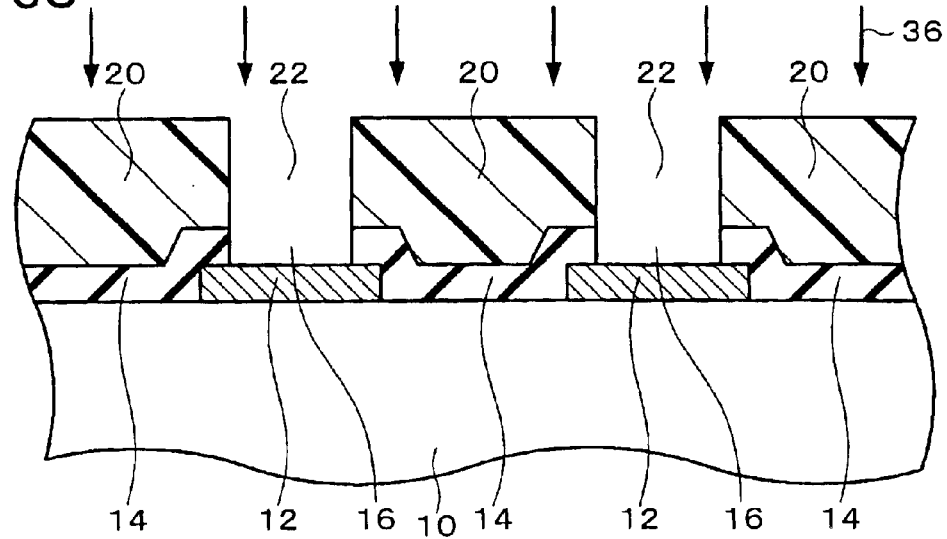

As shown in FIG. 3C, using the penetrating holes 22, openings 16 are formed in the insulating film 14. In more detail, with the patterned resist layer 20 as a mask, the parts of the insulating film 14 within the penetrating holes 22 are removed, and at least a portion of the pads 12 is exposed. By means of this, the step of forming the openings 16 in the insulating film 14, and the step of forming a metal layer (bumps) on the pads 12 can be carried out using the penetrating holes 22 formed once in the resist layer 20. Therefore, the labor, cost and so on of exposure, development, removal, and so on of the resist layer 20 can be saved.

The openings 16 in the insulating film 14 are formed by etching. The means of etching may be any of chemical, physical, or use a combination of these properties. The etching characteristics may be anisotropic as in dry etching or the like, or isotropic as in wet etching or the like. A novolac-based material is amenable to dry etching.

The openings 16 may be formed with a diameter the same as the diameter of the penetrating holes 22, or with a smaller diameter. If the diameter of the openings 16 is made smaller than the diameter of the penetrating holes 22, then by forming the metal layer (bumps) within the penetrating holes 22, the surface of the pads 12 need not be exposed. Alternatively, the diameter of the openings 16 may be formed, for example by using wet etching, to exceed the diameter of the penetrating holes 22.

Next, the surface of the resist layer 20 is hardened. The hardening of the resist layer 20 is carried out by applying energy which causes cross-linking in the resist layer 20. The energy may include thermal energy, light energy (for example, visible light or ultraviolet radiation), or a combination thereof. These forms of energy can be used according to the characteristics of the material of the resist layer 20.

The resist layer 20 includes a resin and a photosensitive agent (photosensitive group). Below, an example is described in which as the resist layer 20 is used a novolac-based resist. More specifically, a novolac-based resist includes novolac resin and a photosensitive agent. The photosensitive agent may be naphthoquinone diazide photosensitive agent.

As shown in FIG. 3C, thermal and light energy is applied to the resist layer 20. That is to say, the resist layer 20 is cured (heated), and light energy 36 is irradiated. By the curing of the resist layer 20, cross-linking can be caused in the novolac resin itself. Then by means of the light energy 36, cross-linking can be caused at a temperature at which the limit of heat resistance of the novolac resin is not exceeded. On the other hand, when a naphthoquinone diazide photosensitive agent is irradiated with the light energy 36, ketene intermediates are formed, and moisture can easily be taken in. If the photosensitive agent takes in moisture, indenecarboxylic acid is formed, and the overall solubility of the resist in an alkaline solvent is increased. However, if in addition to irradiating the light energy 36, the resist layer 20 is cured, then moisture is eliminated from the resist layer 20, the reaction of the photosensitive agent with water is prevented, and cross-linking of the photosensitive agent and the novolac resin can be caused. In this way, the resist layer 20 is polymerized by the cross-linking reaction, and thus hardened. In more detail, the resist layer 20 has at least the surface hardened. If the surface is hardened, solution of the resist layer 20 by for example an alkaline solvent can be prevented. The resist layer 20 may be hardened for a thickness in the range of approximately 2 to 3 μm from the extreme surface.

The temperature of curing the resist layer 20 is preferably in the range of not less than the temperature to prevent a reaction between the photosensitive agent and water, and not more than the limit temperature of heat resistance of the resist layer 20. The resist layer 20 may be heated to at least 100° C.

The light energy 36 is a light wave such as to cause cross-linking with respect to at least one of the resin and photosensitive agent. That is to say, the wavelength of the light energy 36 can be selected to be a range appropriate to the materials of the resin and photosensitive agent. The light energy 36 may be ultraviolet radiation (wavelength from 1 nm to 360 nm approximately), or visible light (wavelength 360 nm to 830 nm approximately), or may be an electron beam.

In the light energy 36, a property of causing cross-linking of the resin may be stronger than a property of causing a reaction of the photosensitive agent. By means of this, a violent reaction of the photosensitive agent can be suppressed, and therefore distortion of the pattern due to foaming of the resist layer 20 can be prevented. As a light wave for instigating the reaction of the photosensitive agent may be used a light wave with a wavelength of approximately 300 nm to 600 nm (for example, 365 nm or 436 nm). As a light wave for the resin cross-linking may be used a light wave with a wavelength close to 250 nm (for example, 254 nm). The light wave may have a wavelength peak not in a range approximately 300 nm to 600 nm (for example, 365 nm or 436 nm) but close to 250 nm (for example, 254 nm). It should be noted that for the irradiation of the light energy 36 a mercury lamp can be used. The amount of irradiation may be adjusted according to the thickness of the resist layer 20.

The process of hardening the resist layer 20 is preferably carried out at reduced pressure. That is to say, it is preferable that at a pressure lower than atmospheric pressure, the resist layer 20 is cured, and irradiated with light energy 36. By doing this, the solvent of the resist layer 20 is driven off (evaporated), and the resist layer 20 cross-linking reaction can be promoted. The process of hardening the resist layer 20 may be carried out at a reduced pressure of, for example approximately 10 to 30 Pa, but may be equally carried out at a further reduced pressure.

It should be noted that when the openings 16 in the insulating film 14 are formed by dry etching, even if the resist layer 20 is etched by the dry etching, since the resist layer 20 is hardened thereafter, the extreme surface thereof can be positively hardened.

The process of hardening the resist layer 20 may be carried out before etching the insulating film 14. In this case, after the insulating film 14 is etched, the process of hardening the resist layer 20 may be further carried out, or this process may be not carried out. By means of these possibilities, since the resist layer 20 is hardened before etching, the resistance of the resist layer 20 to dry etching or the like can be increased.

Figure 4A:
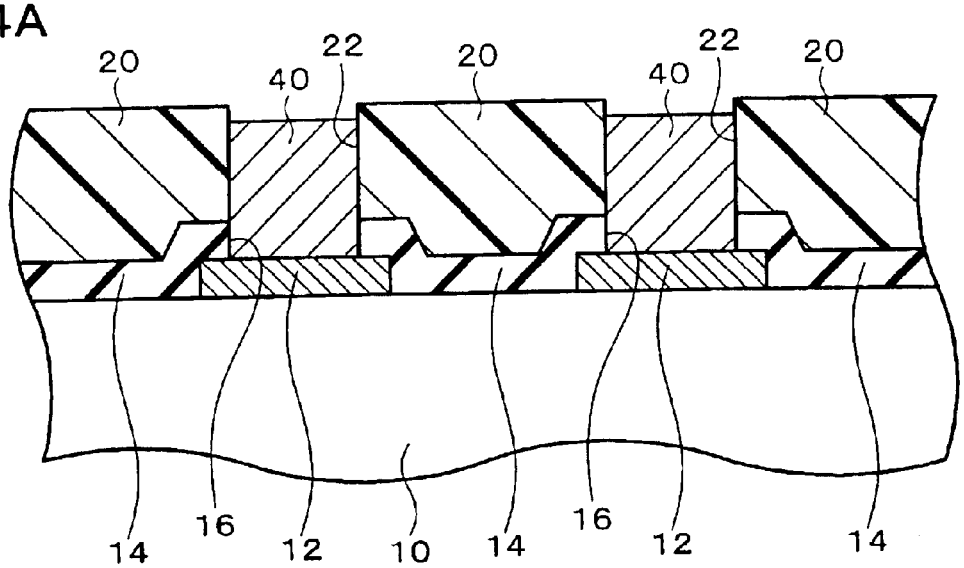
FIGS. 4A to 4C illustrate the bump forming method according to the first embodiment of the present invention.

As shown in FIG. 4A, a metal layer is formed using the penetrating holes 22. The metal layer is formed from a single layer or multiple layers. In the example described below, the metal layer includes first and second metal layers 40 and 42. The metal layers may be formed from any one of nickel, gold, copper, palladium, and tin, or may be formed from a metal including tin and at least one selected from Ag, Cu, Bi, and Zn, or may be formed from a plurality of these metals. For example, the metal layer may be any of: a layer of nickel; a layer of nickel and gold; a layer of nickel and copper; a layer of copper; a layer of nickel, gold and copper; a layer of nickel, copper and tin; a layer of nickel, gold, copper and tin; a layer of nickel, gold, copper, palladium and tin; and a layer of nickel, palladium, copper, palladium and tin, but the material is not limited to this. In place of tin, silver tin or copper tin may be formed. Of multiple layers, the lowest layer may be formed of nickel and the outermost layer of gold or tin.

First, within the penetrating holes 22 the first metal layer 40 is formed. Since the penetrating holes 22 communicate with the openings 16, the first metal layer 40 can be provided to be electrically connected to the pads 12. The first metal layer 40 is formed to be the same height as the height of the penetrating holes 22 (the thickness of the resist layer 20) or not to exceed that height. The first metal layer 40 may be a single layer as shown in the drawings, or may be multiple layers. The first metal layer 40 may be formed from one or a plurality of nickel, gold and copper.

The first metal layer 40 may be formed by electroless plating. To carry out electroless plating, an alkaline solvent may be used. In electroless plating, heat treatment may be carried out. In this embodiment, by hardening the surface of the resist layer 20, the penetrating holes 22 can be prevented from deforming or made less liable to deformation due to the alkaline solvent or heat. The example shown below has the first metal layer 40 formed as a nickel layer. A nickel layer has a lower cost than a gold layer, and can be formed in a shorter time.

First, when the pads 12 are formed of aluminum, using an alkaline zinc solvent, zincate treatment is applied on the pads 12. That is to say, the surface of the aluminum (pads 12) is substituted by zinc. When providing the alkaline zinc solvent on the pads 12, the semiconductor wafer 10 may be immersed in the solvent.

When depositing zinc on the surface of the pads 12, after immersing the pads 12 in the alkaline zinc solvent, the substitution zinc may be dissolved with sulfuric acid, and the immersion in the alkaline zinc solvent repeated. Before applying the zincate treatment to the pads 12, the residue of the insulating film 14 of the semiconductor chip 10 is preferably dissolved with a particular solvent (for example, a dilute hydrofluoric acid solvent). Furthermore, after dissolving the residue of the insulating film 14, it is preferable for the pads 12 to be immersed in an alkaline solvent, and for an oxide film on the exposed parts of the pads 12 to be removed. By means of these measures, the surface of the aluminum (pads 12) can be satisfactorily substituted by zinc.

Next, on the pads 12 with the surface substituted by zinc, an electroless nickel plating fluid is provided, and through a zinc and nickel substitution reaction, a nickel layer is formed on the pads 12. This process is carried out with the semiconductor wafer 10 immersed in the electroless nickel plating fluid. In this case, the solvent may be heated to 90° C. or thereabouts. The height of the nickel layer can be adjusted by the working temperature and time, the amount of plating fluid, the pH, and the number of plating operations (number of turns) and so on. It should be noted that between the pads 12 and the nickel layer, substituted zinc may remain on the surface of the pads 12.

By means of this, since the surface of the resist layer 20 is hardened before carrying out the electroless plating, by using an alkaline solvent the metal layer can be formed while the resist layer 20 is not dissolved, or the progress of solution is delayed. By hardening the surface, the resistance of the resist layer 20 to heat can be increased, and therefore even if heat treatment is carried out in the electroless plating, the metal layer can be formed without the resist layer 20 being deformed. By means of these measures, the bumps can be formed in the desired form, with the pattern of the resist layer 20 (the shape of the penetrating holes 22) not deformed.

Distinct from the above description, without carrying out zincate treatment, a solvent including a reducing agent such as palladium or the like may be provided on the aluminum pads 12, and thereafter an electroless nickel plating fluid provided, thus depositing nickel with palladium or the like as nuclei, and forming a nickel layer on the pads 12.

When the pads 12 are formed of a material including copper, for example when a nickel layer is formed on the pads 12, a solvent including a reducing agent such as palladium or the like may be provided on the pads 12, and thereafter an electroless nickel solvent provided, thus depositing nickel with palladium or the like as nuclei.

When the first metal layer 40 is formed of another metal (gold, copper, or the like, as listed above), this can be carried out by immersing the semiconductor wafer 10 in a particular solvent (for example, a gold plating fluid or copper plating fluid). In this case, an alkaline solvent may be used, and the solvent may be heated.

It should be noted that when the metal layer is formed by electroless plating, and when the semiconductor wafer 10 is immersed in the required solvent, it is preferable for the reverse side and the edges of the semiconductor wafer 10 to be previously covered by a protective film. While the semiconductor wafer 10 is immersed in the solvent, it is preferable for light to be shut off. By means of these measures, changes in electrical potential between electrodes in the solvent occurring as a result of immersion of the semiconductor wafer 10 can be prevented. That is to say, the treatment of deposition of metal or the like by electroless plating on the pads 12 can be made uniform.

Figure 4B:
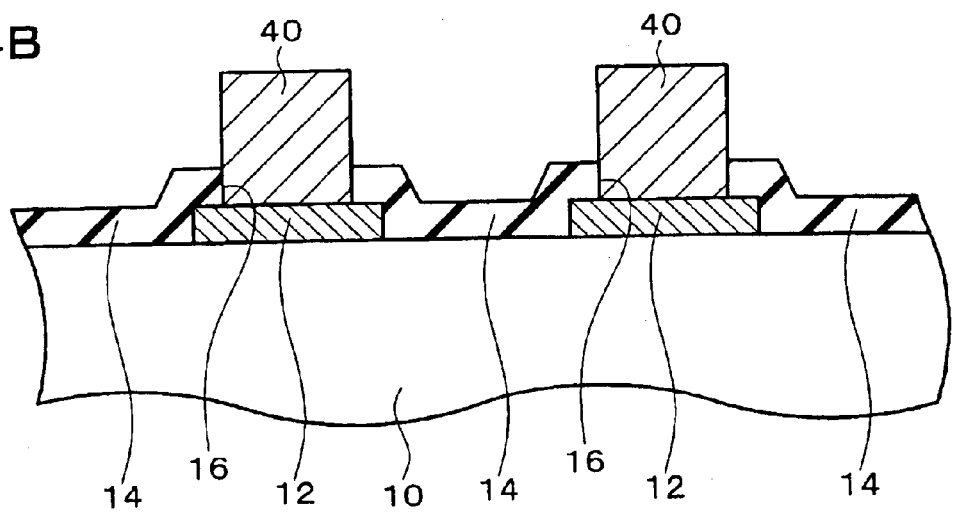

As shown in FIG. 4B, the resist layer 20 is removed. The resist layer 20 may be removed using a solvent which is a combined aqueous solution of sulfuric acid and hydrogen peroxide. As in the example described above, the first metal layer 40 is formed to correspond to the shape of the penetrating holes 22. That is to say, even if electroless plating, in which the metal growth is isotropic, is applied, the spread of the metal layer in the lateral (width) direction can be restrained, and the growth in the height direction caused. Furthermore, since even if an alkaline solvent, or heat treatment is applied, the resist layer 20 is resistant to deformation, the metal layer can be formed in the desired shape, without deforming the shape of the penetrating holes 22.

Figure 4C:
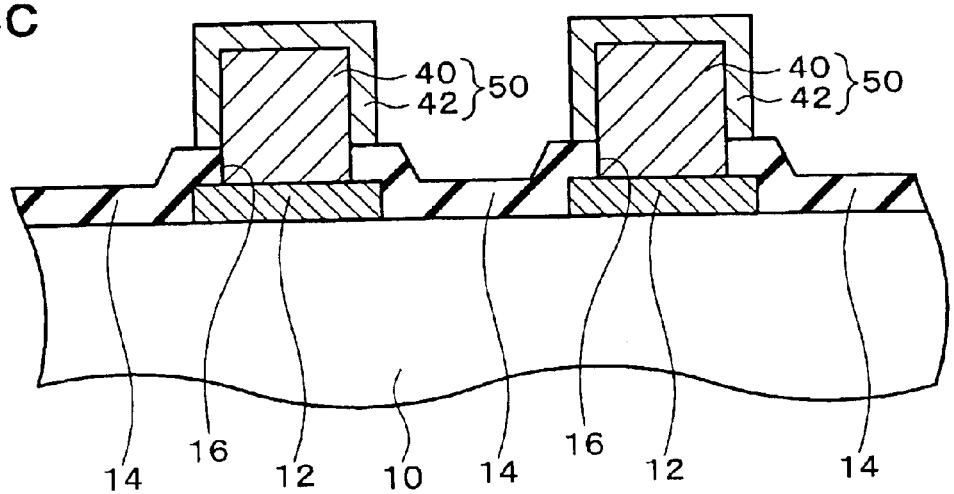

As shown in FIG. 4C, if required, a second metal layer 42 is formed on the surface of the first metal layer 40. The second metal layer 42 is formed after removing the resist layer 20. That is to say, the second metal layer 42 is formed to cover the surface of the first metal layer 40 including the edge surface. By means of this, oxidation of the first metal layer 40 (for example, nickel layer) can be prevented. The second metal layer 42 comprises a single layer or multiple layers, and at least the surface thereof is preferably formed of gold or copper. By means of this, a positive electrical connection of the metal layer to an interconnecting pattern and the like can be achieved. The second metal layer 42 may be formed by electroless plating, for example, by providing an electroless gold plating fluid on the first metal layer 40 (nickel layer), and forming the second metal layer 42 (gold layer) on the surface thereof. It should be noted that the first and second metal layers 40 and 42 may be termed bumps 50.

According to the method of bump formation in this embodiment, since the surface of the resist layer 20 is hardened after it is patterned, deformation of the resist layer 20 in the subsequent process can be prevented. In particular, when the bumps are formed using electroless plating, since the resistance of the resist layer 20 with respect to an alkaline solvent or to heat treatment can be increased, the bumps can be formed with the desired form. Therefore, even if the pads 12 have a narrow pitch, the bumps 50 can be formed with no short circuits between bumps 50 formed on adjacent pads 12.

It should be noted that the case has been described in which a positive type resist is used as the resist layer 20, but in the invention of this embodiment there is no impediment to a negative type resist being used. That is to say, as the resist layer 20 may be used one such that when irradiated with the energy 30, the solubility decreases (negative type). When a negative type of resist layer 20 is used, the form of the mask 32 is the inverse of that for the positive type.

As the resist layer 20, a chemically amplified resist (for example, acid catalyzed resist) may be used. An acid catalyzed resist has as its principal constituents a base resin (for example, novolac resin) and an acid generator (for example, a photo acid generator), and may include a solution inhibitor or cross-linking agent. By means of energy (light, in the case when a photo acid generator is used), acid is generated by the acid generator, and with the acid as a catalyst the reaction is promoted. A chemically amplified resist (for example, an acid catalyzed resist) may be either a positive type or a negative type.

When a positive type resist is used, the surface of the resist layer 20 layer (approximately 2 to 3 $\mu$m from the surface) is hardened, but if the whole of the resist layer 20 can be hardened this is preferable. For example, using a chemically amplified resist, cross-linking of the resist may be promoted. In more detail, using a negative type chemically amplified resist (for example, an acid catalyzed resist), by chained cross-linking of the base resin (for example, novolac resin), the entire resist layer 20 in the thickness direction may be hardened. By doing this, deformation of the resist layer 20 is eliminated, the resistance to alkali is increased, and bumps of the desired form can be more accurately formed.

Figure 5:
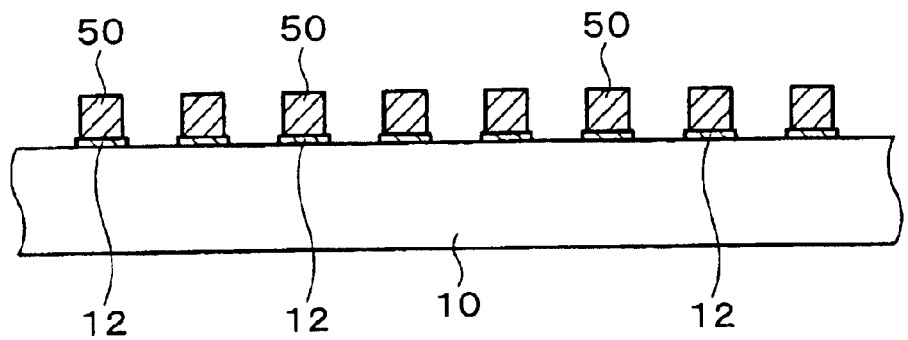
FIG. 5 illustrates the bump forming method according to the first embodiment of the present invention.

FIG. 5 is a sectional view of the semiconductor wafer 10 formed by the above process. On each of the pads 12 of the semiconductor wafer 10, bumps 50 are formed. The height of the bumps 50 may be at least 10 $\mu$m, and for example approximately from 13 to 22 $\mu$m. By means of the bumps 50, the electrical connection with the interconnecting pattern and the like can easily be achieved. It should be noted that in a subsequent process the semiconductor wafer 10 is cut into a plurality of semiconductor chips 18.

Figure 6:
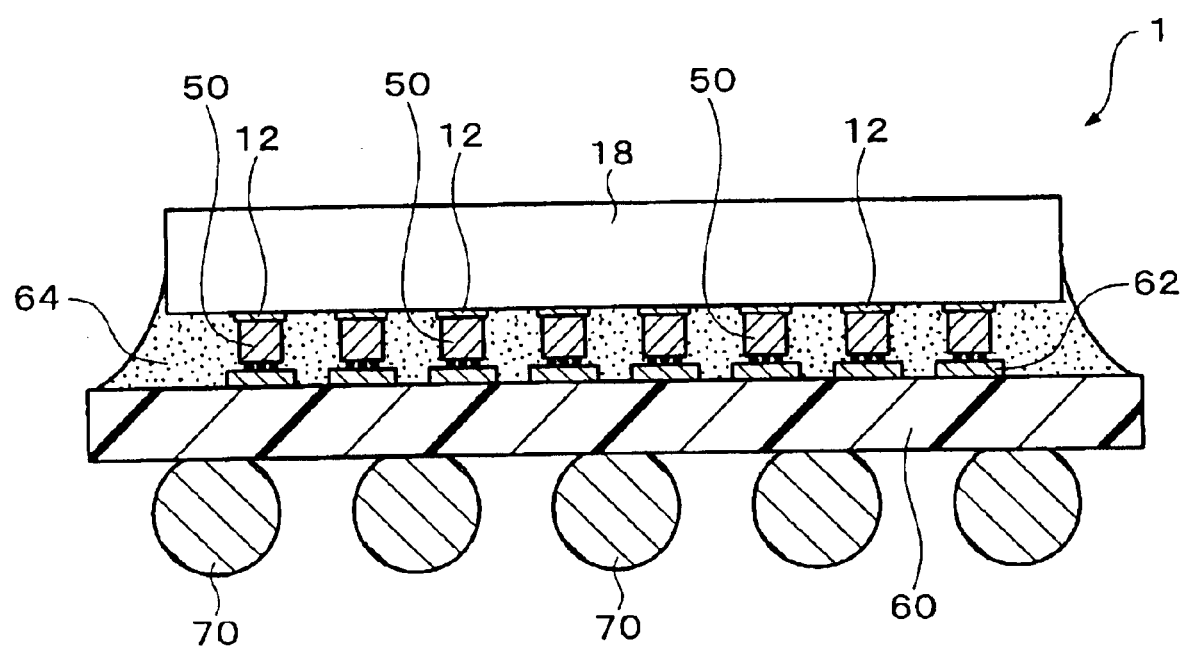
FIG. 6 illustrates the semiconductor device according to the first embodiment of the present invention.

FIG. 6 shows the semiconductor device of this embodiment. A semiconductor device 1 includes a semiconductor chip 18 having the above described bumps 50, a substrate 60 on which is formed an interconnecting pattern 62, and a plurality of external terminals 70.

The semiconductor chip 18 is subjected, as a flipchip, to face down bonding on the substrate 60. In this case, the interconnecting pattern 62 (lands) formed on the substrate 60, and the bumps 50 are electrically connected. For the electrical connection, an anisotropic conductive material 64 such as an anisotropic conductive film (ACF), anisotropic conductive paste (ACP), or the like may be used, and conducting particles introduced between the bumps 50 and the interconnecting pattern 62 (particularly the lands). Alternatively, a metal bond such as Au—Au, Au—Sn, brazing material (including solder) or the like, or the shrink force of insulating resin, may be used to electrically connect the bumps 50 and the interconnecting pattern 62 (particularly the lands).

The external terminals 70 are electrically connected to the interconnecting pattern 62 through through holes or the like not shown in the drawings. The external terminals 70 may be solder balls. The external terminals 70 may be formed by printing with solder or the like, and subjecting to a reflow process. Without positively forming the external terminals 70, using a solder cream applied to the motherboard, when mounting on the motherboard, during melting, external terminals may be effectively formed as a result of surface tension. This semiconductor device is a so-called land grid array type of semiconductor device.

In addition to the example shown in the drawing, the semiconductor chip 18 may be disposed in a device hole in the substrate, and the bumps 50 and inner leads projecting into the device hole may be electrically connected. That is to say, the invention shown by this embodiment may be applied to a semiconductor device using TAB technology.

It should be noted that the method of manufacture of the semiconductor device of this embodiment, according to the above described method of formation of the bumps 50, includes a step of forming bumps on the pads 12 of the semiconductor wafer 10 (or semiconductor chip 18) including a metal layer (first and second metal layers 40 and 42).

Second Embodiment

FIGS. 7A to 8C show a second embodiment of a method of bump formation to which the present invention is applied. In this embodiment, as far as possible the description of the first embodiment can be applied.

Figure 7A:
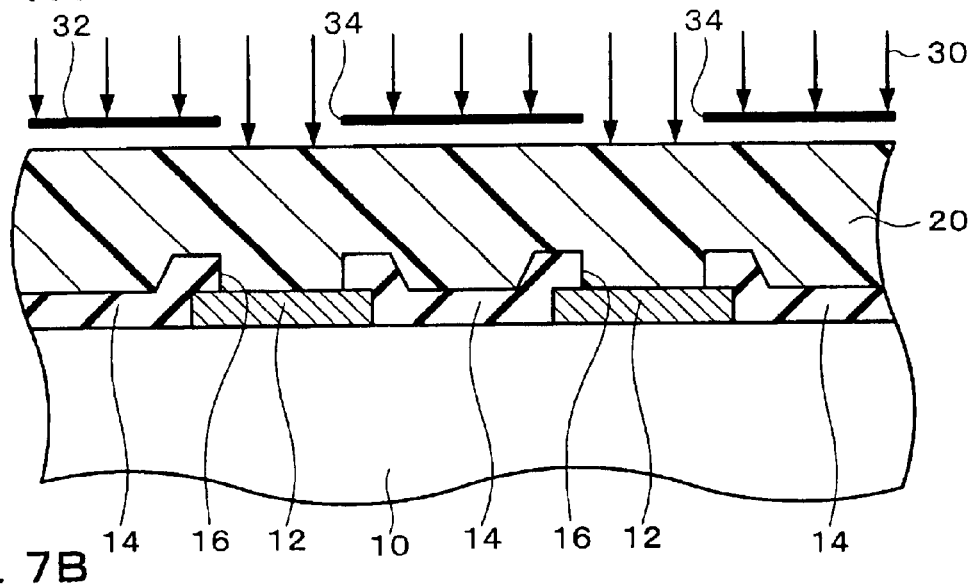
FIG. 7A to FIG. 7C illustrate the bump forming method according to a second embodiment of the present invention.

As shown in FIG. 7A, in this embodiment, as the semiconductor wafer 10 is used one in which a part of the pads 12 is previously formed openings in the insulating film 14. That is to say, before providing the resist layer 20 for forming the metal layer, the openings 16 are previously formed in the insulating film 14, and part of the pads 12 is exposed. The pads 12 are covered on their periphery, avoiding the center, by the insulating film 14.

Figure 7B:
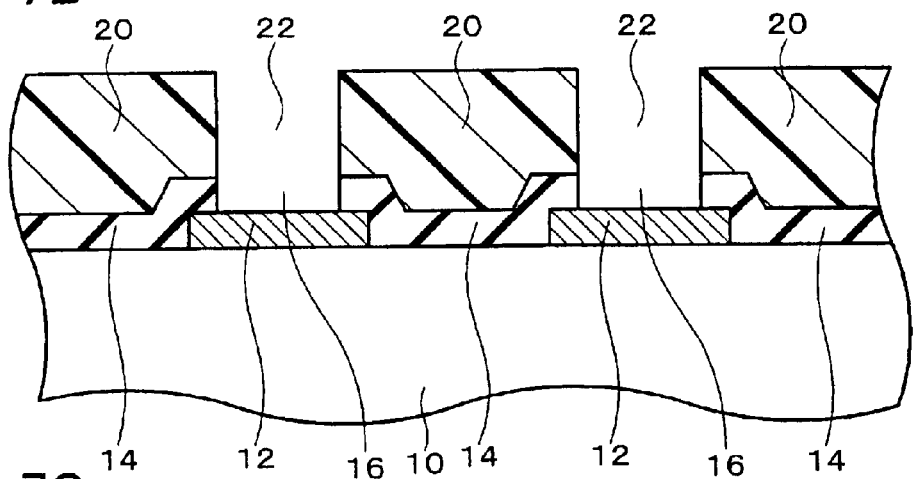

As shown in FIGS. 7A and 7B, the resist layer 20 is patterned, and the penetrating holes 22 are formed. The patterning of the resist layer 20 is carried out using the mask 32 in which the openings 34 are formed, and irradiating with energy 30 through the mask 32. The penetrating holes 22 are formed to communicate with the openings 16 in the insulating film 14. It should be noted that before providing the resist layer 20, using for example an alkaline solvent, zincate treatment may be carried out. By means of this, immersion of the resist layer 20 in the alkaline solvent can be avoided.

Figure 7C:
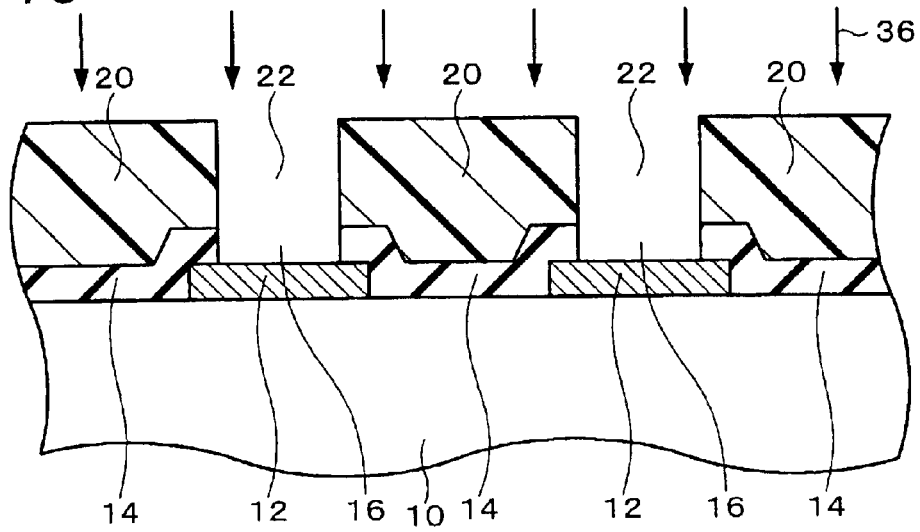

As shown in FIG. 7C, the resist layer 20 is cured, and irradiated with light energy 36, so that its surface is hardened. In more detail, the description of the above described embodiment applies.

Figure 8A:
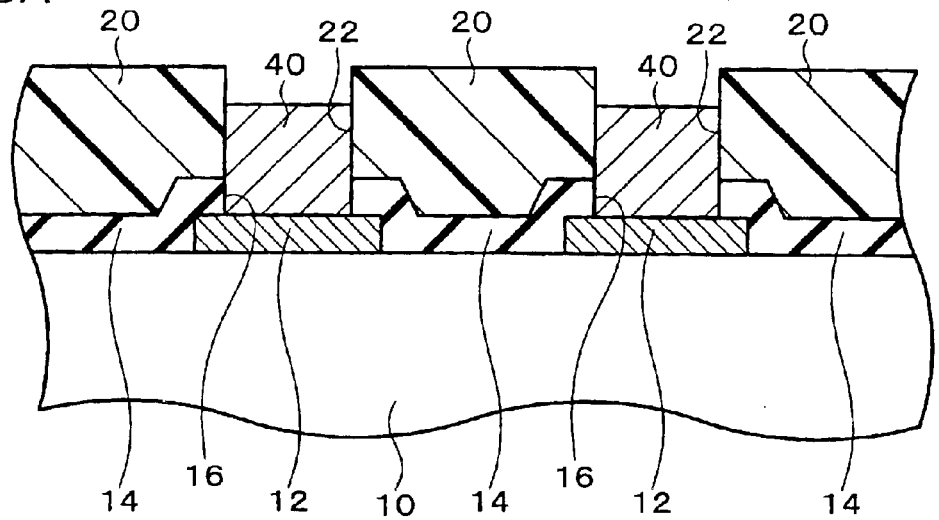
FIG. 8A to FIG. 8C illustrate the bump forming method according to the second embodiment of the present invention.
Figure 8B:
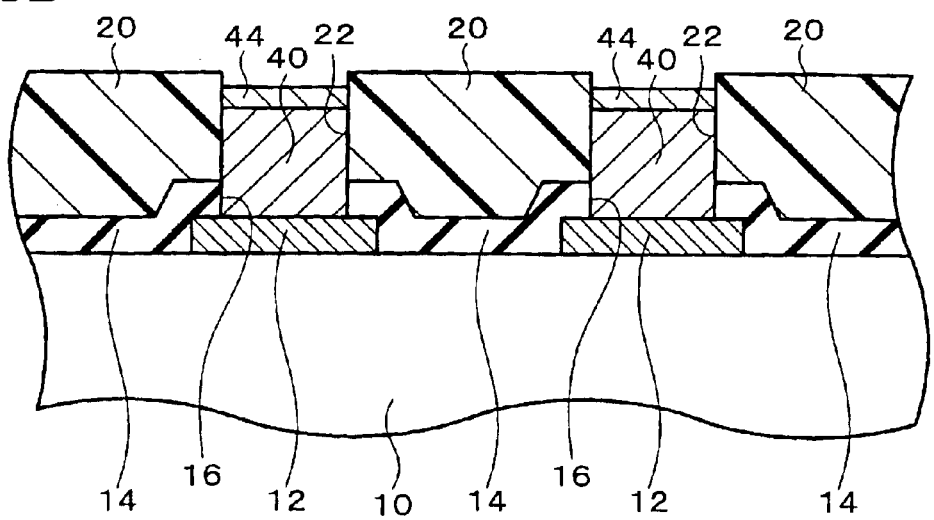
Figure 8C:
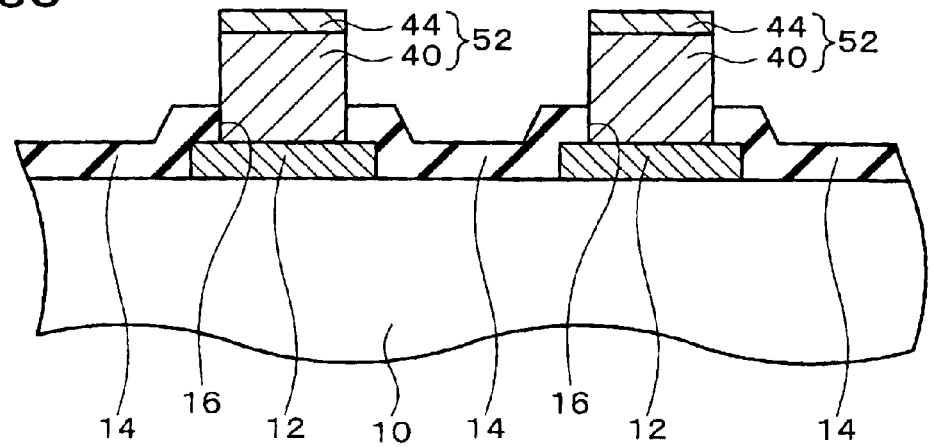

As shown in FIGS. 8A to 8C, the metal layer (first and second metal layers 40 and 44) is formed in the penetrating holes 22. The metal layer is formed by electroless plating. In more detail, the first and second metal layers 40 and 44 are formed using the penetrating holes 22 (leaving the resist layer 20). The first and second metal layers 40 and 44 may be termed bumps 52. The method of formation of the first metal layer 40 and the form thereof is as described above. The second metal layer 44 is formed over the first metal layer 40. The second metal layer 44 is preferably formed of gold or copper or the like. In this way, using the extremities of the bumps 52, a satisfactory electrical connection with the interconnecting pattern or the like can be achieved. By having a gold layer (the second metal layer 44) only on the top surface of the bumps 52, a brazing material or solder which has high wettability with the gold layer can be made less likely to spread to the outside of the bumps 52 when melted.

According to the method of bump formation of this embodiment also, the same effect can be obtained as in the above described embodiment. The semiconductor device of this embodiment includes a semiconductor chip on which the bumps 52 are formed. The method of manufacture of a semiconductor device includes a step of forming the bumps 52.

Third Embodiment

Figure 9A:
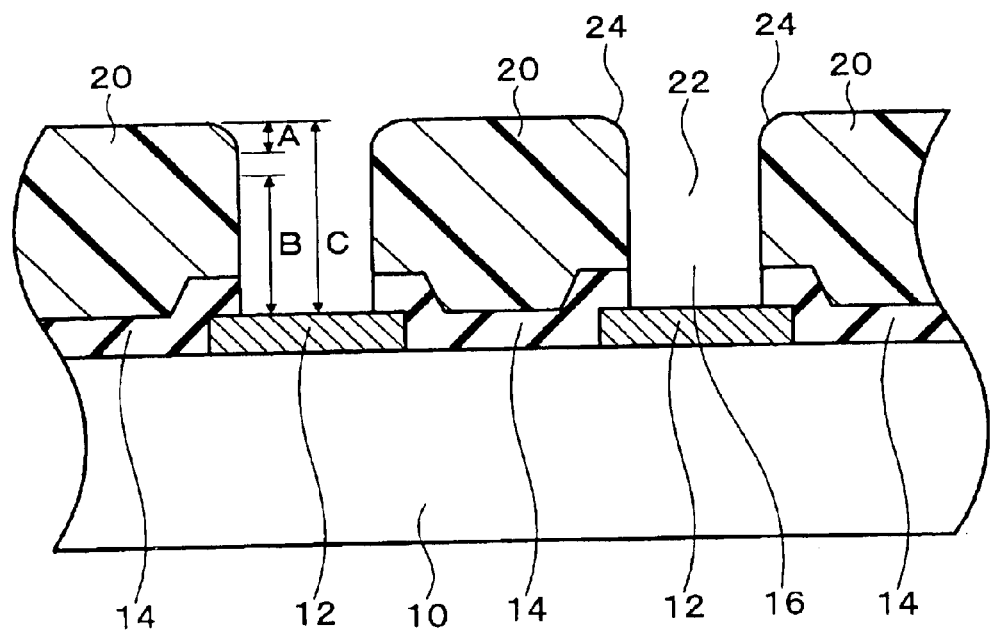
FIGS. 9A and 9B illustrate the bump forming method according to a third embodiment of the present invention.
Figure 9B:
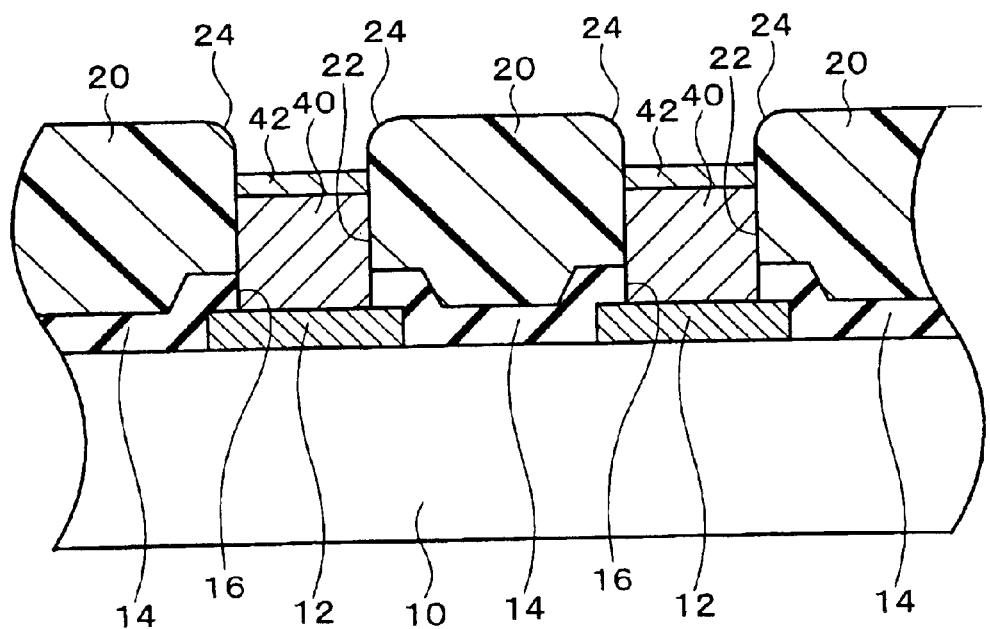

FIGS. 9A and 9B show a third embodiment of a method of bump formation to which the present invention is applied. In this embodiment, as far as possible the description of the first and second embodiments can be applied.

As shown in FIG. 9A, the resist layer 20 is patterned. In the example shown in the drawing, the resist layer 20 is formed with a slope at the opening extremity 24 of the penetrating holes 22. The slope of the opening extremity 24 may be formed as a curved surface or a flat surface. The opening extremity 24 of the penetrating holes 22 may be the to be formed so as to widen in the opening direction. This slope of the opening extremity 24 is commonly created in the exposure and development of the resist layer 20, during etching of the insulating film 14, in the process of hardening the resist layer 20, or in a subsequent step of electroless plating or the like. Because of this, the shape of the penetrating holes 22 is deformed, with the end result that bumps of the desired form cannot be formed.

To ameliorate this, in this embodiment the metal layer is formed to be lower than the opening extremity 24 of the penetrating holes 22. In other words, the resist layer 20 is previously formed to be thicker, to the extent that the metal layer is formed at a portion lower than the opening extremity 24 of the penetrating holes 22. More specifically, the resist layer 20 is formed with a thickness such that the thickness (height) A of the sloping opening extremity 24 of the penetrating holes 22 which widen in the opening direction, the thickness (height) B with which the metal layer is formed, and the overall thickness (height) C of the resist layer 20 satisfy the following:

$$A+B \leq C$$

By doing this, as shown in FIG. 9B, in the part of the penetrating holes 22 in which the metal layer (first and second metal layers 40 and 42) is formed, the perpendicular walls can be maintained. By making the resist layer 20 thicker, the metal layer can be formed with a desired thickness.

The thickness of the metal layer may be, for example, approximately 13 to 22 $\mu$m. The thickness of the sloping opening extremity 24 of the penetrating holes 22 varies depending on the material of the resist layer 20, and the handling of the resist layer 20 (for example, approximately 2 to 3 μm). The thickness of the resist layer 20 may be determined to take these factors into account.

According to the method of bump formation of this embodiment, by forming the metal layer lower than the opening extremity 24 of the penetrating holes 22, even if the opening extremity 24 of the penetrating holes 22 slopes, bumps for example of straight form can be formed.

It should be noted that the semiconductor device of this embodiment includes a semiconductor chip on which are formed bumps including the above described metal layer (first and second metal layers 40 and 42). The method of manufacture of a semiconductor device includes a step of forming the metal layer (first and second metal layers 40 and 42).

Figure 10:
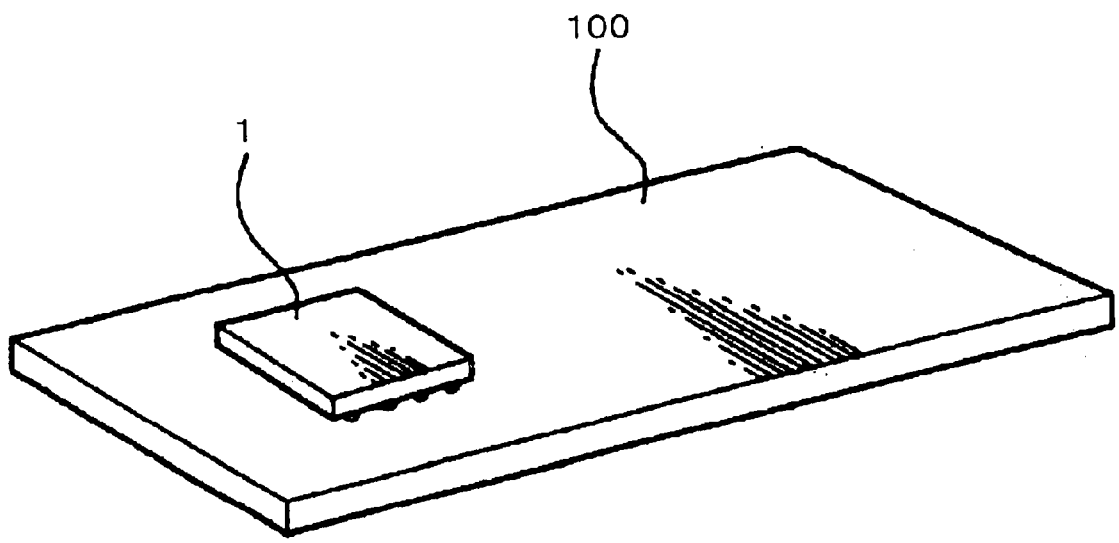
FIG. 10 shows a circuit board on which is mounted the semiconductor device according to one embodiment of the present invention.

FIG. 10 shows a circuit board 100 on which is mounted this embodiment of the semiconductor device 1. The circuit board 100 generally uses an organic substrate such as a glass epoxy substrate or the like. On the circuit board 100, an interconnecting pattern is formed in a desired circuit, for example, of copper or the like, and this interconnecting pattern is electrically connected with the external terminals 70 of the semiconductor device 1.

Figure 11:
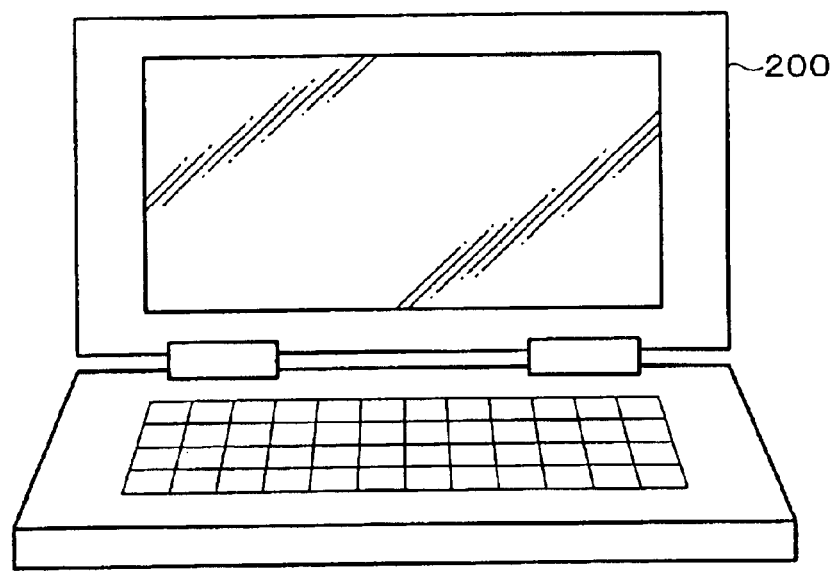
FIG. 11 shows an electronic instrument having the semiconductor device according to one embodiment of the present invention.
Figure 12:
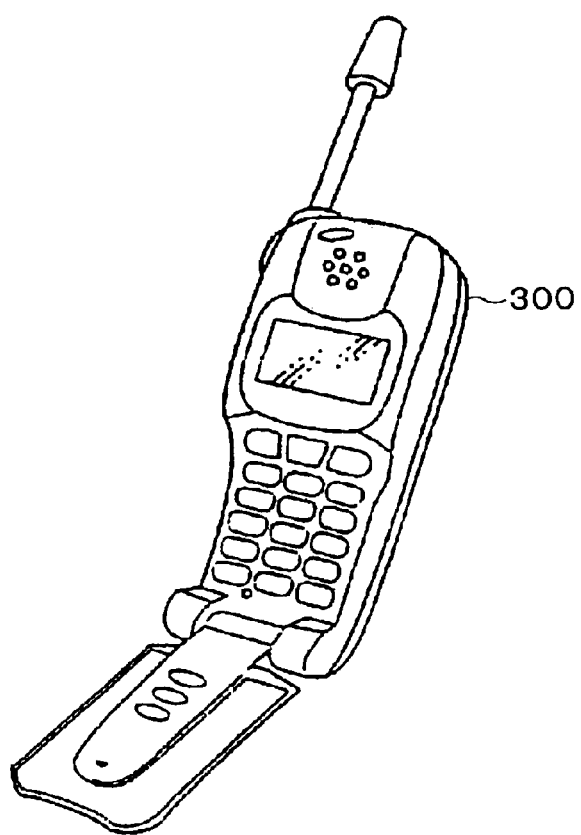
FIG. 12 shows an electronic instrument having the semiconductor device according to one embodiment of the present invention.

Then as an electronic instrument having the semiconductor device 1 to which the present invention is applied, FIG. 11 shows a notebook personal computer 200, and FIG. 12 shows a mobile telephone 300.

What is claimed is:

1. A method of bump formation comprising the steps of:
    patterning a resist layer so as to have a penetrating hole above a pad, the resist layer including a resin and a photosensitive agent, the resin having a property in which cross-linking is caused by either of thermal energy and light energy, the photosensitive agent having properties of causing cross-linking by the thermal energy and increasing absorbability of moisture by the light energy, reaction in the photosensitive agent with the moisture increasing solubility of the resist layer with respect to solvent;
    heating the resist layer to at least 100° C. and irradiating light on the resist layer at the same time to cause the cross-linking of the resin and the photosensitive agent with the moisture in the resist layer evaporating; and
    forming a metal layer which is electrically connected to the pad, within the penetrating hole.

2. The method of bump formation as defined in claim 1, wherein:
    in the light irradiated on the resist layer, the property of causing the cross-linking of the resin is stronger than the property of increasing the absorbability of the moisture in the photosensitive agent.

3. The method of bump formation as defined in claim 1, wherein:
    the resist layer has as principal constituents the resin and the photosensitive agent.

4. The method of bump formation as defined in claim 1, wherein:
    the moisture is eliminated from the resist layer by heating the resist layer.

5. The method of bump formation as defined in claim 1, wherein the resin of the resist layer is a novolac resin.

6. The method of bump formation as defined in claim 1, wherein:
    the pad is covered by an insulating film at an extremity, avoiding a center portion; and
    the penetrating hole is formed to communicate with an opening in the insulating film.

7. The method of bump formation as defined in claim 1, wherein:
    the pad is covered by an insulating film; and
    an opening is formed in the insulating film to expose at least part of the pad with the penetrating hole as a mask opening.

8. The method of bump formation as defined in claim 7, wherein the opening in the insulating film is formed by dry etching before the step of hardening the resist layer.

9. The method of bump formation as defined in claim 1, wherein the resist layer is formed of a positive type of material.

10. The method of bump formation as defined in claim 1, wherein the resist layer is formed of a negative type of material.

11. The method of bump formation as defined in claim 1, wherein the penetrating hole is formed by exposing the resist layer to remove part of the resist layer over the pad in the step of patterning the resist layer.

12. The method of bump formation as defined in claim 1, wherein:
    the resist layer is formed to be sloping at an opening extremity of the penetrating hole; and
    the metal layer is formed to be lower than the opening extremity of the penetrating hole in the step of forming the metal layer.

13. The method of bump formation as defined in claim 1, wherein the metal layer is formed by electroless plating in the step of forming the metal layer.

14. The method of bump formation as defined in claim 13, wherein the electroless plating includes a step of using an alkaline solvent.

15. The method of bump formation as defined in claim 1, wherein the metal layer is any one of a layer of nickel, a layer of nickel and gold, a layer of nickel and copper, a layer of copper, a layer of nickel and gold and copper, and a layer of nickel and copper and tin.

16. The method of bump formation as defined in claim 1, further comprising a step of removing the resist layer.

17. The method of bump formation as defined in claim 1, wherein the step of heating and irradiating light on the resist layer is carried out at pressure reduced from atmospheric pressure.

18. A method of manufacturing a semiconductor device, comprising:
    a step of forming a bump including the metal layer on the pad of a semiconductor element by the bump forming method as defined in claim 1.

19. A semiconductor device manufactured by the method of manufacturing a semiconductor device as defined in claim 18.

20. A circuit board on which is mounted the semiconductor device as defined in claim 19.

21. An electronic instrument having the semiconductor device as defined in claim 19.

* * * * *